(12) United States Patent
Yoneyama

(10) Patent No.: US 6,894,947 B2
(45) Date of Patent: May 17, 2005

(54) SEMICONDUCTOR INTEGRATED CIRCUIT FOR A LIQUID CRYSTAL DISPLAY DRIVER SYSTEM

(75) Inventor: Tsuyoshi Yoneyama, Fujimi-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/634,736

(22) Filed: Aug. 5, 2003

(65) Prior Publication Data

US 2004/0095265 A1 May 20, 2004

(30) Foreign Application Priority Data

Aug. 6, 2002 (JP) ........................................ 2002-228390

(51) Int. Cl.[7] ................................................ G11C 8/00
(52) U.S. Cl. ........................ 365/233; 365/191; 369/30; 369/50
(58) Field of Search ................................ 341/100, 101; 365/233, 191; 369/30, 50, 58

(56) References Cited

U.S. PATENT DOCUMENTS

| | | | | |
|---|---|---|---|---|
| 4,970,687 A | * | 11/1990 | Usami et al. ............... | 365/233 |
| 5,440,514 A | * | 8/1995 | Flannagan et al. .......... | 365/233 |
| 5,546,355 A | * | 8/1996 | Raatz et al. ................. | 365/233 |
| 5,568,445 A | * | 10/1996 | Park et al. ................... | 365/233 |
| 5,715,201 A | * | 2/1998 | Khieu ......................... | 365/191 |
| 5,815,463 A | * | 9/1998 | Shih et al. ................... | 365/233 |
| 6,567,337 B1 | * | 5/2003 | Sprague et al. ............. | 365/233 |

* cited by examiner

*Primary Examiner*—Michael Tokar
*Assistant Examiner*—Lam T. Mai
(74) *Attorney, Agent, or Firm*—Harness, Dickey & Pierce, P.L.C.

(57) ABSTRACT

A semiconductor integrated circuit is provided which comprises a serial/parallel conversion circuit for converting serial data which is input together with a clock signal into parallel data; a memory for storing the parallel data converted by the serial/parallel conversion circuit; and a write pulse producing circuit for producing a pulse to be used to set the period of time for writing data into the memory. The semiconductor integrated circuit converts serial data into parallel data, stores the parallel data, and stably operates even when the cycle of data writing/reading is shortened.

3 Claims, 5 Drawing Sheets

SEMICONDUCTOR INTEGRATED CIRCUIT FOR A LIQUID CRYSTAL DISPLAY DRIVER SYSTEM

BACKGROUND OF THE INVENTION

1. Field of the Invention

The present invention relates to semiconductor integrated circuits for converting serial data into parallel data and storing the data, and more particularly to semiconductor integrated circuits such as LCD drivers for driving liquid crystal displays (LCDs) with random access memories (RAMs) embedded therein.

2. Related Art

Some LCD drivers for driving a number of areas separated in the segment direction of LCD convert serial data, which is input via an interface, into parallel data and write it into embedded RAMs and then read out the data stored in the RAMs so as to produce driving signals. FIG. 4 illustrates such a conventional LCD driver.

As shown in FIG. 4, an LCD driver 100 includes a shift register 109 for converting serial data (DATA), which is input together with a clock signal CLK, into parallel data, a latch circuit 110 for latching the parallel data, and a RAM 111 for storing the latched data.

Moreover, the LCD driver 100 includes a counter 101 for counting clock signals CLK and outputting a pulse every 9 counts from an output terminal Q9; a flip-flop FF1 for outputting a pulse signal S2 in synchronization with a pulse signal S1 output from the counter 101; a delay circuit 102 for outputting a pulse signal S3 obtained by delaying the pulse signal S2; a flip-flop FF2 for outputting a pulse signal S4 in synchronization with the pulse signal S3; a delay circuit 103 for outputting a pulse signal S5 obtained by delaying the pulse signal S4; a buffer circuit 104; two NOR circuits 105 and 106; two inverters 107 and 108; and a command producing circuit 112 for controlling data writing/reading to and from the RAM111.

FIG. 5 shows operations at parts of the LCD driver shown in FIG. 4. After an inversion resetting signal (RESET bar) turns to a high-level in response to canceling the reset state, a 1-bit data/command identifier D/C and 8-bit data D7 to D0 are sequentially input to the shift register 109 in synchronization with the clock signal CLK as shown in FIG. 5, so that the total 9-bit signals are stored in a flip-flop in the shift register 109. In the meantime, the counter 101 counts 9 pulses included in the clock signal CLK and outputs the pulse signal S1 from the output terminal Q9.

The flip-flop FF1 turns the pulse signal S2 to a high-level in synchronization with the leading edge of the pulse signal S1. The delay circuit 102 delays the pulse signal S2 by a predetermined period of time and outputs the pulse signal S3. The pulse signal S3 is inverted by the NOR circuit 105. Here, the inverted pulse signal S3 is input to a reset terminal R of the flip-flop FF1, so that the flip-flop FF1 is reset and the pulse signal S2 returns to a low-level. As a result, the flip-flop FF1 outputs the pulse signal S2 including a pulse having a pulse width the same as the time delayed by the delay circuit 102. The pulse width of the pulse signal S3 is also the same as that of the pulse signal S2.

The latch circuit 110 latches the 1-bit data/command identifier D/C and the 8-bit data D7 to D0, which are output as parallel data from the shift register 109, in synchronization with the trailing edge of the pulse signal S3. Since the pulse signal S3 is produced by delaying the pulse signal S2 with the delay circuit 102, the signals are latched by the latch circuit after completely outputting the signals from the shift register 109.

The flip-flop FF2 turns the pulse signal S4 to a high-level in synchronization with the leading edge of the pulse signal S3. The delay circuit 103 delays the pulse signal S4 by a predetermined period of time and outputs the pulse signal S5. The pulse signal S5 is inverted by the NOR circuit 106. Here, the inverted pulse signal S5 is input to a reset terminal R of the flip-flop FF2, so that the flip-flop FF2 is reset and the pulse signal S4 returns to a low-level. As a result, the flip-flop FF2 outputs the pulse signal S4 including a pulse having a pulse width the same as the time delayed by the delay circuit 103. The pulse width of the pulse signal S5 is the same as that of the pulse signal S4.

The pulse signal S5 from the buffer circuit 104 as well as the data D7 to D0 from the latch circuit 110 are input to the RAM111. Moreover, the pulse signal S5 from the buffer circuit 104 as well as the data/command identifier D/C and the data D7 to D0 from the latch circuit 110 are input to the command producing circuit 112. When the data/command identifier D/C indicates a command, the command producing circuit 112 determines the timing for data writing/reading to and from the RAM111 and designates an address in accordance with the command sent as the data D7 to D0 and with the pulse signal S5. On the other hand, when the data/command identifier D/C indicates data, the RAM111 writes the data D7 to D0 into designated addresses. Here, the pulse width of the pulse signal S5, which indicates a period of time for writing data into the RAM111, is determined by the time delayed by the delay circuit 103.

As described above, in the conventional semiconductor integrated circuit, the period of time for writing data into a RAM is determined by time delayed by a delay circuit. As a result, the delay circuit needs to be adjusted in some cases when the RAM is replaced with new one, and also shortening the cycle of data writing/reading remains difficult.

In light of the above problems, the present invention aims to provide a semiconductor integrated circuit that includes a function of converting serial data into parallel data in order to store the data and also enjoys stable operation even when the cycle of the data writing/reading is shortened.

SUMMARY

In order to solve the above problems, a semiconductor integrated circuit according to the present invention comprises a serial/parallel conversion circuit for converting serial data, which is input together with a clock signal, into parallel data; a memory for storing the parallel data converted by the serial/parallel conversion circuit; and a write pulse producing circuit, which produces a write pulse to be used for setting a period of time for writing data into the memory by counting clock signals.

The semiconductor integrated circuit may further include a latch circuit for latching the parallel data output from the serial/parallel conversion circuit and supplying the data to the memory. Also, the serial/parallel conversion circuit may include a shift register.

Moreover, the write pulse producing circuit may include a counter for counting clock signals, a first coincidence detecting circuit for detecting coincidence between a count value of the counter and a first predetermined value, a second coincidence detecting circuit for detecting coincidence between the count value of the counter and a second predetermined value; and a sequence circuit for producing the write pulse by setting an output level to a first level during a period starting from detection of the coincidence by the first coincidence detecting circuit to detection of the coincidence by the second coincidence detecting circuit and by setting the output level to a second level during a period starting from detection of the coincidence by the second coincidence detecting circuit to detection of the coincidence by the first coincidence detecting circuit.

According to the invention configured as above, counting the clock signals input together with serial data produces the write pulse to be used for setting the period of time for writing data into the memory. Therefore, the invention can provide a semiconductor integrated circuit that can stably operate even when the cycle of data writing/reading is shortened.

DETAILED DESCRIPTION

Embodiments of the present invention are explained below with reference to the drawings.

Figure 1:
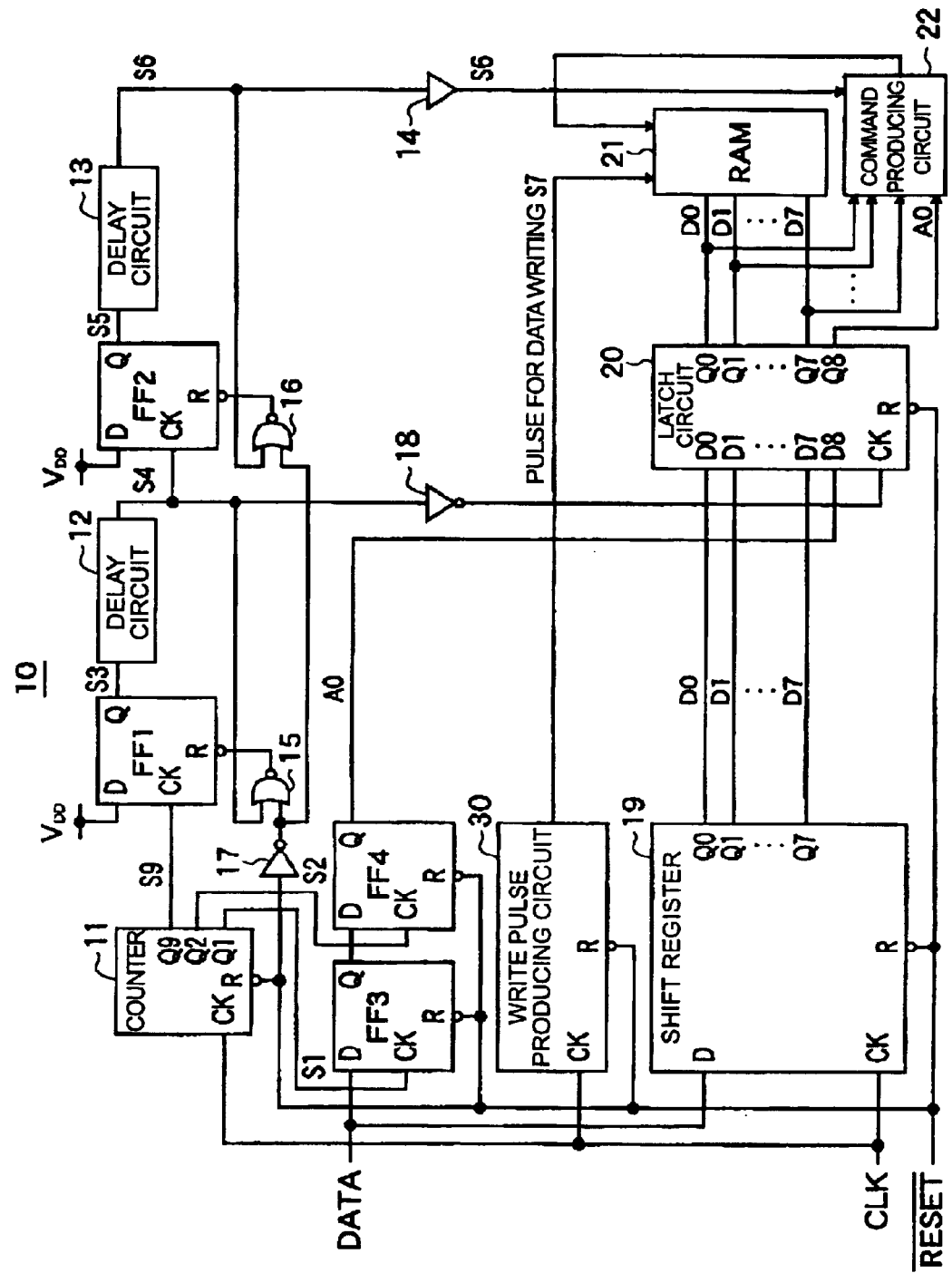
FIG. 1 illustrates a configuration of a semiconductor integrated circuit according to the first embodiment.

FIG. 1 shows the configuration of a semiconductor integrated circuit according to the first embodiment of the present invention. In this embodiment, the present invention is applied to an LCD driver for driving a number of areas separated in the segment direction of a LCD.

As shown in FIG. 1, the semiconductor integrated circuit 10 includes a shift register 19 for converting serial data (DATA), which is input together with a clock signal CLK, into parallel data, a latch circuit 20 for latching the parallel data, and a RAM 21 for storing the latched data.

The semiconductor integrated circuit 10 further includes a counter 11 for counting pulses included in the clock signal CLK; a flip-flop FF1 for outputting a pulse signal S3 in synchronization with a pulse signal S9 output from the counter 11; a delay circuit 12 for outputting a pulse signal S4 produced by delaying the pulse signal S3; a flip-flop FF2 for outputting a pulse signal S5 in synchronization with the pulse signal S4; a delay circuit 13 for outputting a pulse signal S6 by delaying the pulse signal S5; a write pulse producing circuit 30 which produces a pulse signal S7 in order to control the period of time for writing data into RAM 21; flip-flops FF3 and FF4 for storing a data/command identifier D/C included in the input serial data (DATA); a buffer circuit 14; two NOR circuits 15 and 16; two inverters 17 and 18; and a command producing circuit 22 for controlling data writing/reading to and from the RAM 21.

Figure 2:
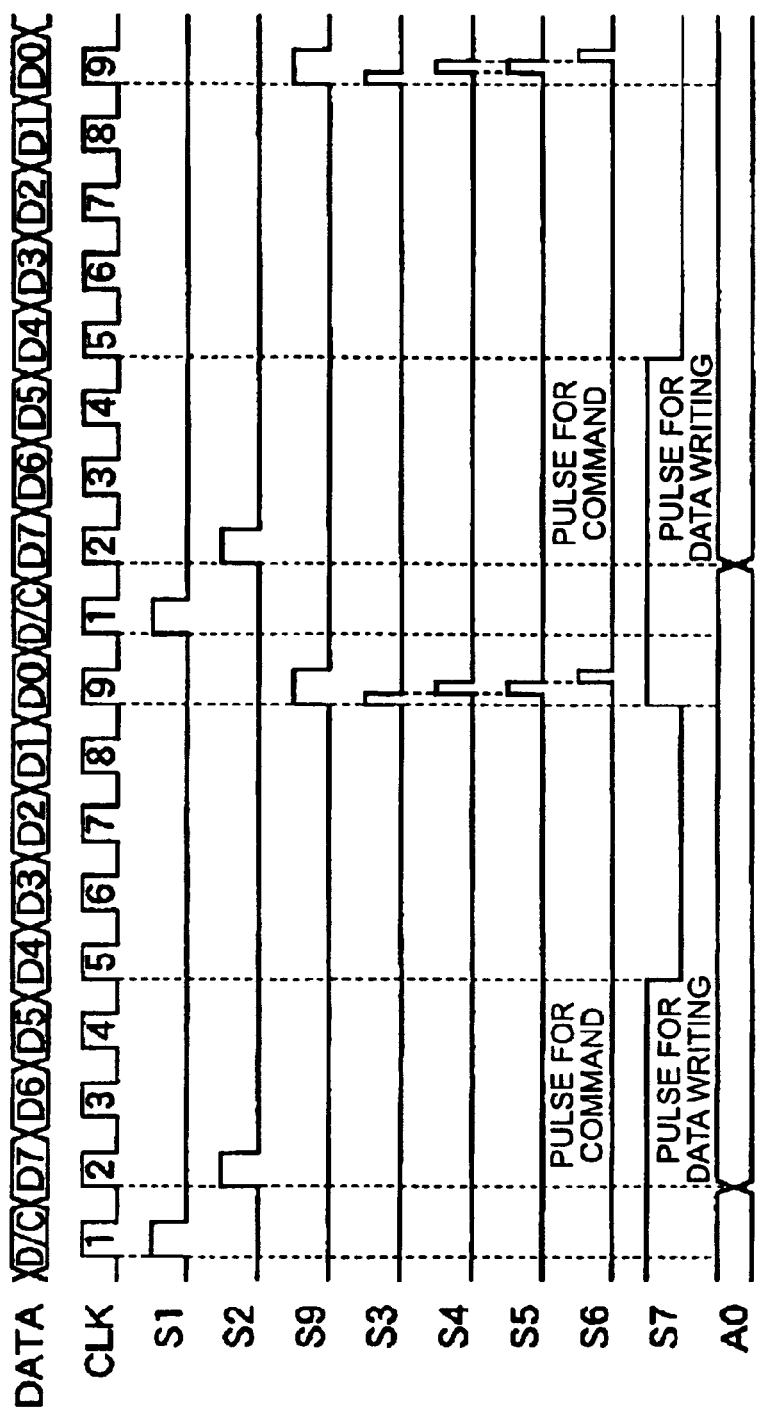
FIG. 2 is a timing chart showing operations at parts of the semiconductor integrated circuit shown in FIG. 1.

FIG. 2 illustrates operations at parts of the semiconductor integrated circuit shown in FIG. 1. After an inversion reset signal (RESET bar) turns to a high-level in response to canceling the reset state, 8-bit data D7 to D0 are sequentially input to the shift register 19 in synchronization with the clock signal CLK as shown in FIG. 2 and stored in the shift register 19. In the mean time, the counter 11 counts pulses included in the clock signal CLK and outputs a pulse signal S1 in correspondence with the first pulse, a pulse signal S2 in correspondence with the second pulse and the pulse signal S9 in correspondence with the ninth pulse.

The flip-flop FF1 turns the pulse signal S3 to a high-level in synchronization with the leading edge of the pulse signal S9. The delay circuit 12 delays the pulse signal S3 by a predetermined period of time and outputs the pulse signal S4. The pulse signal S4 is inverted by the NOR circuit 15. Here, the inversed pulse signal S4 is input to a reset terminal R of the flip-flop FF1, so that the flip-flop FF1 is reset and the pulse signal S4 returns to a low-level. As a result, the flip-flop FF1 outputs the pulse signal S3 including a pulse having a pulse width the same as the time delayed by the delay circuit 12. The pulse width of the pulse signal S4 is also the same as that of the pulse signal S3.

The flip-flop FF3 stores the data/command identifier D/C in synchronization with the pulse signal S1 output from an output terminal Q1 of the counter 11. Moreover, the flip-flop FF4 stores an output signal of the flip-flop FF3 in synchronization with the pulse signal S2 output from an output terminal Q2 of the counter 11 and outputs the signal as a data/command identifying signal A0.

The latch circuit 20 latches the 1-bit data/command identifying signal A0 output from the flip-flop FF4 and the 8-bit data D7 to D0 output from the shift register 19 in synchronization with the trailing edge of the pulse signal S4. Since the pulse signal S4 is produced by delaying the pulse signal S3 with the delay circuit 12, the signals are latched by the latch circuit 20 after being completely output from the flip-flop FF4 and the shift register 19.

The flip-flop FF2 turns the pulse signal S5 to a high-level in synchronization with the leading edge of the pulse signal S4. The delay circuit 13 delays the pulse signal S5 by a predetermined period of time and outputs the pulse signal S6. The pulse signal S6 is inverted by the NOR circuit 16. Here, the inverted pulse signal S6 is input to a reset terminal R of the flip-flop FF2, so that the flip-flop FF2 is reset and the pulse signal S5 returns to a low-level. As a result, the flip-flop FF2 outputs the pulse signal S5 including a pulse having a pulse width equal to the time delayed by the delay circuit 13. The pulse width of the pulse signal S6 is also the same as that of the pulse signal S5. The pulse signal S6 is used for implementing a command with the command producing circuit 22.

On the other hand, the write pulse producing circuit 30 outputs the pulse signal S7 for data writing which is at a high-level during the period from the leading edge of the ninth pulse of the clock signal CLK to the leading edge of the fifth pulse.

The pulse signal (write pulse) S7 from the write pulse producing circuit 30 and the data D7 to D0 from the latch circuit 20 are input to the RAM 21. Moreover, the pulse signal S6 from the buffer circuit 14 and the data/command identifying signal A0 as well as the data D7 to D0 from the latch circuit 20 are input to the command producing circuit 22. When the data/command identifying signal A0 indicates a command, the command producing circuit 22 determines the timing for the data writing/reading to and from the RAM 21 and designates addresses in accordance with the command sent as the data D7 to D0. On the other hand, when the data/command identifying signal A0 indicates data, the RAM 21 writes the data D7 to D0 into the designated addresses.

The pulse width of the pulse signal S7, which indicates the period of time for writing data into the RAM 21, is determined by counting the pulses included in the clock signal CLK with the write pulse producing circuit 30.

Broadening the pulse width of the pulse signal S7 allows data to be reliably written even when the cycle of data writing/reading is shortened to implement speedy operation.

Figure 3:
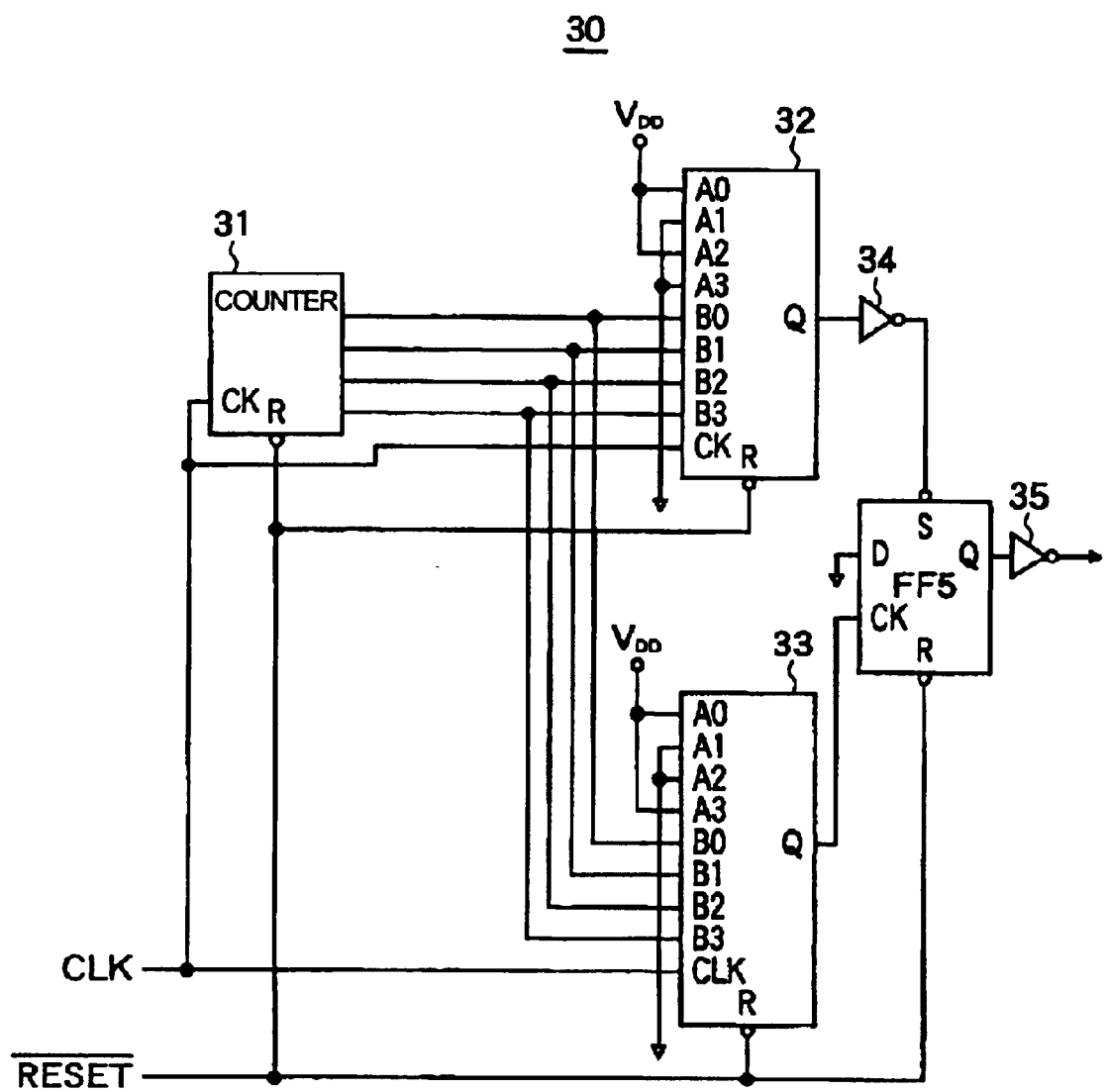
FIG. 3 illustrates a configuration of a write pulse producing circuit shown in FIG. 1.
Figure 4:
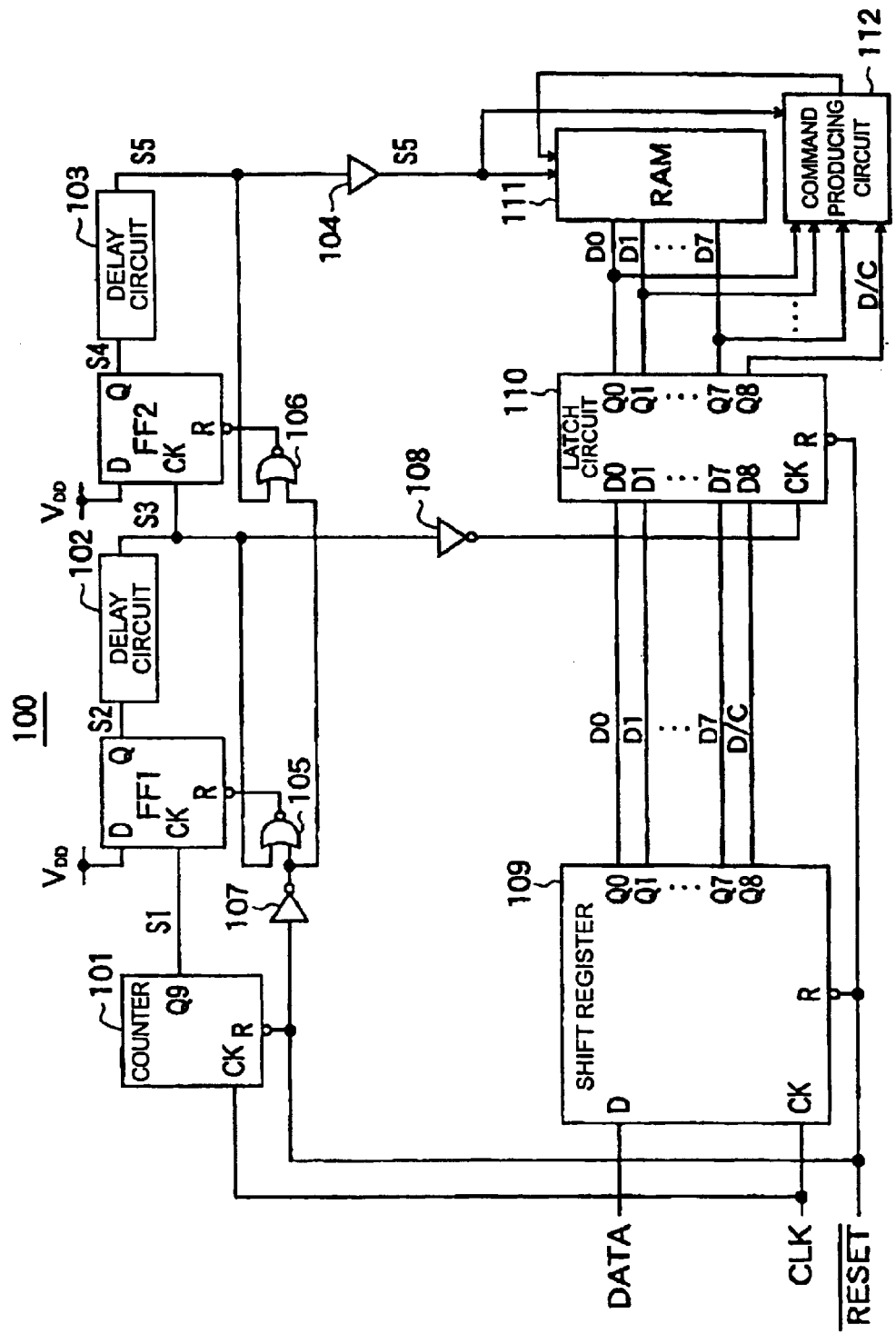
FIG. 4 illustrates a configuration of a conventional LCD driver.
Figure 5:
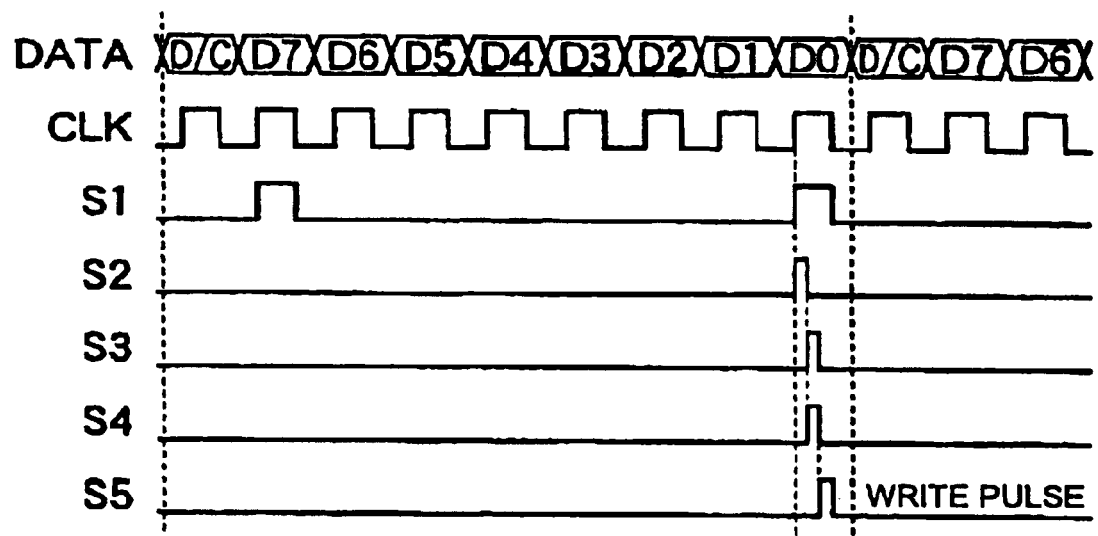
FIG. 5 is a timing chart showing operations at parts of the LCD driver shown in FIG. 4.

Next, the write pulse producing circuit shown in FIG. 1 is explained in detail. FIG. 3 shows a configuration of the write pulse producing circuit. As shown in FIG. 3, the write pulse producing circuit 30 comprises a counter 31 for counting pulses included in the clock signal CLK; an coincidence detecting circuit 32 for detecting coincidence between a 4-bit count value output from the counter 31 and the first value (5="0101"), which is set in advance; an inverter 34 for inverting a signal output from the coincidence detecting circuit 32; a coincidence detecting circuit 33 for detecting coincidence between the 4-bit count value output from the counter 31 and the second value (9="1001"), which is set in advance; a flip-flop FF5 for outputting a pulse for wiring negative logic based on the signals output from the coincidence detecting circuits 32 and 33; and an inverter 35 for inverting the write pulse for writing negative logic output from the flip-flop FF5.

After the reset state is cancelled and then the inversion reset signal is turned to a high-level, the output signal of the flip-flop FF5 is at a low-level. The coincidence detecting circuit 32 detects coincidence between the count value of the counter 31 and the first value (5) and outputs a pulse when the counter 31 has counted the fifth pulse included in the clock signal CLK. Consequently, the output signal of the flip-flop FF5 is set to a high-level, and the inverter 35 outputs a low-level signal.

Subsequently, the coincidence detecting circuit 33 counts coincidence between the count value of the counter 31 and the second value (9) and outputs a pulse when the counter 31 has counted the ninth pulse included in the clock signal CLK. The output signal of the flip-flop FF5 is turned to a low-level in synchronization with the pulse output from the coincidence detecting circuit 33, and the inverter 35 outputs a high-level signal.

As explained above, the write pulse producing circuit 30 outputs a high-level signal during the period that the count value is 9 and 1 to 4 while outputting a low-level signal during the period that the count value is 5 to 8. Moreover, in this invention, the output level of the write pulse producing circuit 30 is set to vary when the count value is 5 and 9; however, the level may be set to change with other count values.

ADVANTAGE OF THE INVENTION

As described above, with this invention, counting clock signals input together with serial data produces write pulses to be used to set the period of time for writing data into a memory. Thus, the invention can provide a semiconductor integrated circuit, which stably operates even when the cycle of data writing/reading is shortened.

The entire disclosure of Japanese Patent Application No. 2002-228390 filed Aug. 6, 2002 is incorporated by reference.

What is claimed is:

1. A semiconductor integrated circuit comprising:
   a serial/parallel conversion circuit receiving serial data and a clock signal, and outputting parallel data;
   a memory storing the parallel data; and
   a write pulse producing circuit producing a write pulse setting a time for writing data into the memory by counting clock signals,
   wherein the write pulse producing circuit includes:
      a counter counting clock signals;
      a first coincidence detecting circuit detecting coincidence between a count value of the counter and a first predetermined value;
      a second coincidence detecting circuit detecting coincidence between the count value of the counter and a second predetermined value; and
      a sequence circuit producing the write pulse by setting an output level to a first level during a period starting from detection of the coincidence by the first coincidence detecting circuit to detection of the coincidence by the second coincidence detecting circuit and by setting the output level to a second level during a period starting from detection of the coincidence by the second coincidence detecting circuit to detection of the coincidence by the first coincidence detecting circuit.

2. The semiconductor integrated circuit described in claim 1, further comprising a latch circuit latching the parallel data output from the serial/parallel conversion circuit and supplying the data to the memory.

3. The semiconductor integrated circuit described in claim 1, wherein the serial/parallel conversion circuit includes a shift register.

* * * * *